(12) United States Patent
Takano et al.

(10) Patent No.: US 6,717,210 B2
(45) Date of Patent: Apr. 6, 2004

(54) TRENCH GATE TYPE SEMICONDUCTOR DEVICE AND FABRICATING METHOD OF THE SAME

(75) Inventors: Akio Takano, Kawasaki (JP); Takahiro Kawano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/289,339

(22) Filed: Nov. 7, 2002

(65) Prior Publication Data

US 2004/0041207 A1 Mar. 4, 2004

(30) Foreign Application Priority Data

Sep. 2, 2002 (JP) ......................................... 2002-257006

(51) Int. Cl.[7] .......................... H01L 29/76; H01L 29/94; H01L 31/062; H01L 31/113; H01L 31/119
(52) U.S. Cl. .......................... 257/330; 257/331; 438/270
(58) Field of Search ................................. 257/135, 330, 257/331, 332, 333, 334, 384; 438/259, 270, 271, 581, 582

(56) References Cited

U.S. PATENT DOCUMENTS

| 5,623,152 | A | * | 4/1997 | Majumdar et al. | .......... 257/330 |
| 5,894,149 | A | * | 4/1999 | Uenishi et al. | .............. 257/331 |
| 6,083,793 | A | * | 7/2000 | Wu | .............................. 438/270 |
| 6,373,097 | B1 | * | 4/2002 | Werner | ......................... 257/329 |
| 6,498,382 | B2 | * | 12/2002 | Hirler et al. | ................. 257/510 |

FOREIGN PATENT DOCUMENTS

JP        2000-183337         6/2000

* cited by examiner

Primary Examiner—Wael M. Fahmy
Assistant Examiner—Hoai Pham
(74) Attorney, Agent, or Firm—Oblon, Spivak, McClelland, Maier & Neustadt, P.C.

(57) ABSTRACT

A trench gate type semiconductor device includes a first semiconductor layer having first and second main surfaces, a second semiconductor layer of a first conductivity type as formed on the first main surface of the first semiconductor layer, a third semiconductor layer of a second conductivity type as formed on the second semiconductor layer, a fourth semiconductor layer of the first conductivity type as formed at a surface of the third semiconductor layer, a gate electrode having a polycrystalline silicon layer being buried in a trench formed to a depth reaching the second semiconductor layer from a surface of the fourth semiconductor layer with a gate insulating film interposed therebetween and having an upper end portion protruding upwardly from a trench upper end opening while having its width greater than a width of the trench and a metal silicide film formed at an upper surface and side surfaces of the upper end portion of the polycrystalline silicon layer, a first main electrode in contact with both the fourth third semiconductor layer, and a second main electrode formed at the second main surface of the first semiconductor layer.

14 Claims, 9 Drawing Sheets

TRENCH GATE TYPE SEMICONDUCTOR DEVICE AND FABRICATING METHOD OF THE SAME

BACKGROUND OF THE INVENTION

1. Field of the Invention

This invention relates to a semiconductor device of the type employing a trench gate structure and also to fabrication methodology thereof.

2. Description of Related Art

As power devices capable of realizing low on-resistances and high-speed switching performances, trench gate type metal oxide semiconductor (MOS) transistors and insulated gate bipolar transistors (IGBTs) are known. FIG. 14 shows an example of the trench-gate MOS transistors (JP-A-2000-183337). This MOS transistor has an $n^+$-type source layer and its underlying p-type base layer, with a stripe-shaped (or mesh-like) trench formed to vertically extend from the $n^+$-source and penetrate the p-base layer resulting in subdivision into a plurality of regions. Each divided region becomes a unit cell with a gate electrode formed at the base layer which is exposed to trench side surfaces. More specifically, each unit cell makes up a vertical MOS transistor with an $n^+$-type drain layer commonly used or "shared" by adjacent ones of vertical transistors.

The trench-buried gate electrode is generally made of olycrystalline silicon or "polysilicon" doped with a chosen impurity. However, such polysilicon gate is limited in electrical resistivity reduction even when phosphorus or arsenic is heavily doped thereinto at an increased concentration. In order to realize ultra-high speed switching operations, a need is felt to further lower the electrical resistance of the gate electrode per se. To this end, with the device of FIG. 14, a silicide film is formed on the surface of the buried polysilicon gate for achievement of the low gate-electrode resistivity required.

The silicide film for reduction of the polysilicon gate resistance is typically fabricated by forming on the surface of a polysilicon film a conductive film made of a metal such as titanium (Ti), cobalt (Co), nickel (Ni) or the like and then thermally processing it to permit the metal film to react with the polysilicon. Unfortunately, this silicide process is encountered with a problem that the sheet resistance unacceptably increases when on-chip gate wiring leads are narrowed beyond a predetermined degree. It has been found that in case the gate width is decreased to less than 1 micrometer ($\mu$m), a Ti silicide ($TiSi_2$) film formed on a phosphorus-doped polysilicon gate results in a critical increase in the sheet resistance. This is called the "thin line" effect (see "Revolution of Logic LSI Technologies", published by Science Forum Corporation), also known as "edge thinning" effect or simply "edge" effect.

In the trench-gate semiconductor device shown in FIG. 14 also, this thin-line effect pauses serious problems if the trench gates further shrink in dimension in pursuance of the quest for higher chip integration in the near future. This would result in reduction or loss of the effectiveness of the silicide process. As far as the trench gate width is designed to stay at 1 $\mu$m or greater, the thin-line effect is avoidable. However, in view of the fact that the trench gate is effective only at their side surfaces opposing the base layer enlarging the trench width would result in unwanted increases in gate capacity and in gate area. This in turn leads to a decrease in switching performance and also to an increase in on-state resistance, which occurs due to a relative decrease in source area within the chip.

Accordingly in the trench-gate semiconductor devices, it is desired to perform shrinkage or miniaturization of a trench gate without having to reduce or loose the inherent effectiveness of the silicide process.

SUMMARY OF THE INVENTION

A trench gate type semiconductor device includes a first semiconductor layer having first and second main surfaces, a second semiconductor layer of a first conductivity type as formed on the first main surface of the first semiconductor layer, a third semiconductor layer of a second conductivity type as formed on the second semiconductor layer, a fourth semiconductor layer of the first conductivity type as formed at a surface of the third semiconductor layer, a gate electrode having a polycrystalline silicon layer being buried in a trench formed to a depth reaching the second semiconductor layer from a surface of the fourth semiconductor layer with a gate insulating film interposed therebetween and having an upper end portion protruding upwardly from a trench upper end opening while having its width greater than a width of the trench and a metal silicide film formed at an upper surface and side surfaces of the upper end portion of the polycrystalline silicon layer, a first main electrode in contact with both the fourth semiconductor layer and the third semiconductor layer, and a second main electrode formed at the second main surface of the first semiconductor layer.

A method of fabricating a trench gate type semiconductor device includes: forming a second semiconductor layer of a first conductivity type on a first main surface of a first semiconductor layer having first and second main surfaces, doping an impurity into a surface of the second semiconductor layer to thereby form a third semiconductor layer of a second conductivity type, doping an impurity into a surface of the third semiconductor layer to form a fourth semiconductor layer of the first conductivity type, forming a trench extending from a surface of the fourth semiconductor layer and penetrating the third semiconductor layer to have a depth reaching the second semiconductor layer, after having formed a gate insulating film on inner surfaces of the trench, depositing over the fourth semiconductor layer a polycrystalline silicon layer in such a manner as to completely bury the trench, etching the polycrystalline silicon layer to form a gate electrode having its main part buried in the trench and an upper end portion protruding upwardly from a trench upper end opening while having a width greater than a width of the trench, forming a metal silicide film at an upper surface and side surfaces of the upper end portion of the gate electrode, and forming a first main electrode in contact with both the fourth semiconductor layer and the third semiconductor layer and a second main electrode in contact with the second main surface of the first semiconductor layer, respectively.

DETAILED DESCRIPTION OF THE INVENTION

Embodiments of this invention will be explained with reference to the accompanying drawings below.

Figure 1A:
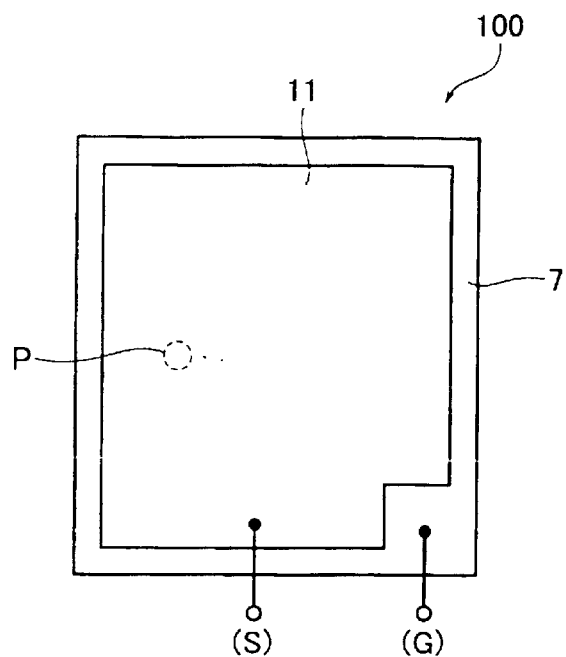
FIGS. 1A and 1B are diagrams showing a plan view and expansion thereof of a MOS transistor in accordance with one embodiment of this invention.
Figure 1B:
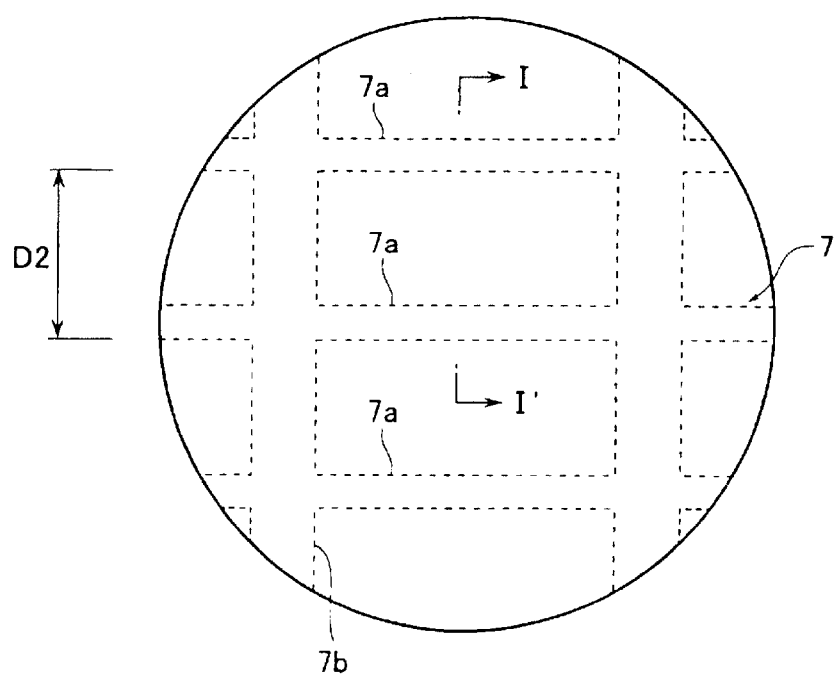
Figure 2:
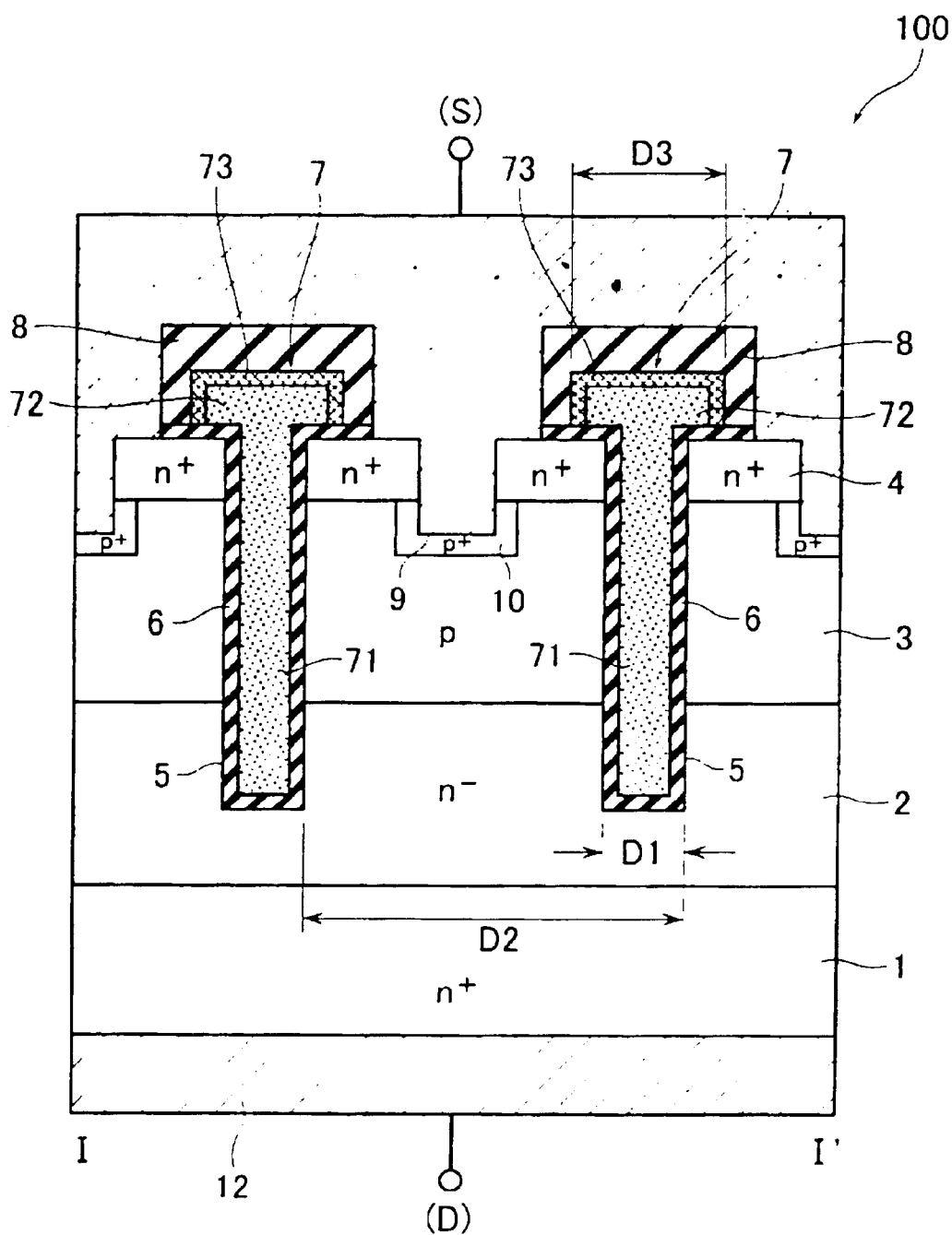
FIG. 2 is a cross-sectional diagram as taken along line I–I' of FIG. 1B.

FIGS. 1A and 1B illustrate a power MOS transistor 100 in accordance with one embodiment of the invention, wherein the former shows a plan view whereas the latter is an expanded plan view of the portion P of FIG. 1A. FIG. 2 is a cross-sectional view as taken along line I–I' of FIG. 1B. Here, as an example that the first and second conductivity types are "n" and "p" types respectively, an n-channel MOS transistor 100 is shown which has a p-type base layer. A heavily doped n (n$^+$) type silicon substrate 1 is a low-resistivity drain layer. On this substrate 1, a lightly doped n (n$^-$) type layer 2 for later use as a high-resistivity drain layer and a p-type layer 3 for use as a base layer are formed. The p-type base layer 3 has its surface portion, in which an n$^+$-type source layer 4 is formed.

A trench 5 is formed as to penetrate the p-base layer 3 from the source layer 4 and to have a depth reaching the n$^-$-type drain layer 2. A gate electrode 7 is formed and buried in this trench 5 with a gate insulating film 6 interposed therebetween. The gate electrode 7 consists essentially of a polycrystalline silicon or "poly-silicon" layer 71 and a metal silicide film 73. The polysilicon layer 71 is buried in trench 5 and is doped with a chosen impurity, such as phosphorus (P) or arsenic (As) at an increased concentration. The metal silicide film 73 is formed on the surface of this polysilicon layer 71. The polysilicon layer 71 has an upper end portion 72, which has its width D3 greater than a width D1 of trench 5 and is protruded upwardly from the source layer 4. The upper end portion 72 is covered or coated with a metal silicide film 73 as formed thereon. In the case of this embodiment, the metal silicide film 73 is made of TiSi$_2$ although other similar suitable silicide materials are employable.

As shown in FIG. 1B, the gate electrode 7 has a plurality of parallel stripe-like portions 7a which are laid out at a prespecified pitch D2 and coupling portions 7b which couple these stripe portions 7a together. In FIG. 1B the stripe portions 7a and the coupler portions 7b constitute a mesh-like pattern. This mesh pattern defines a plurality of "closed" subdivided regions, which make up unit cells respectively. Optionally at least one of the stripe portions 7a may have its terminate end which is not coupled to the others. In this case also, a region surrounded by the neighboring stripe portions 7a becomes a unit cell. In other words, this MOS transistor is arranged by an ensemble of multiple unit cells which are partitioned by the trenches 5 while sharing the substrate 1 that is the low-resistivity drains thereof.

Practically in this embodiment, 0.35-$\mu$m rules are used for trench gate fabrication, resulting in the width D1 of trench 5 becoming less than or equal to 1 $\mu$m. The layout pitch D2 of trench 5 is a few or a several $\mu$m. On the other hand, the buried polysilicon layer 71 has such a T-shaped profile that its upper end portion 72 is protruded upwardly from the source layer 4 while having its width D3 of 1 $\mu$m or greater, with the metal silicide film 73 formed on the upper surface and side faces of this upper end portion 72. Thus, even when the metal silicide film 73 is made of TiSi$_2$, there are no appreciable increases in sheet resistance otherwise occurring due to the thin-line effect. This in turn makes it possible to obtain the gate electrode with low electrical resistance.

The gate electrode 7 is covered with an interlayer dielectric (ILD) film 8. Formed on this ILD film 8 is a source electrode 11. In addition, a drain electrode 12 is formed on the bottom or back surface of the substrate 1. The source electrode 11 is in contact with the source layer 4 through an opening or hole as formed in ILD film 8 at a gap portion of each gate electrode 7. The source electrode 11 is in contact with both the source layer 4 and the p-base layer 3. More specifically, a groove 9 which reaches p-base layer 3 from source layer 4 is formed in each unit cell region laterally interposed between gate electrode 7. In this groove 9, a p$^+$-type layer 10 is formed. Source electrode 11 is in contact with source layer 4 and base layer 3 due to this electrode being buried in the groove 9.

In this way, letting the source electrode 11 be in contact with the upper and side surfaces of the source layer 4 makes it possible to obtain contacts of low resistances. This is a structure preferable for achievement of low on-voltage. Additionally, by letting source electrode 11 be in contact with the p-base layer 3 also, electrical charge carriers of p-base layer 3 are rapidly released and drained to source electrode 11 in turn-off events. Thus it becomes possible to achieve a switching operation at a high speed while at the same time enabling voltage potential stabilization of p-base layer 3 during turn-off.

Figure 3:
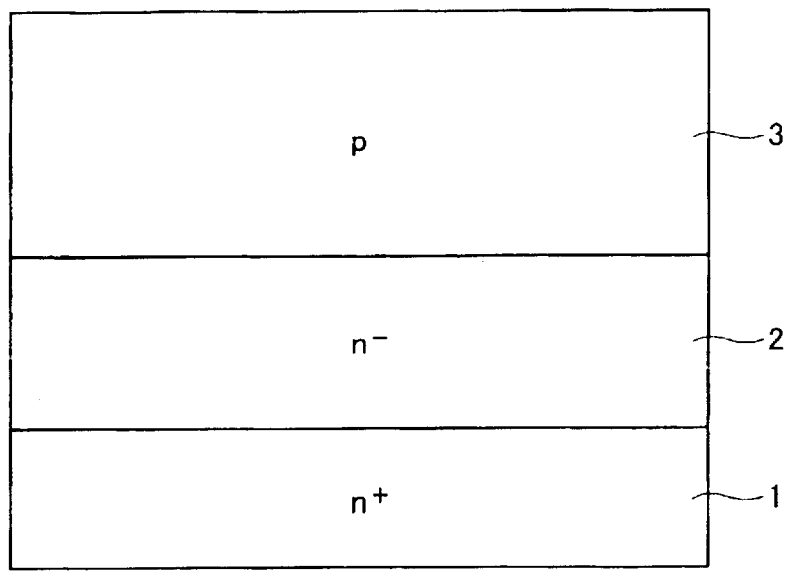
FIG. 3 is a sectional diagram showing a process up to formation of a p-type base layer of the MOS transistor.
Figure 4:
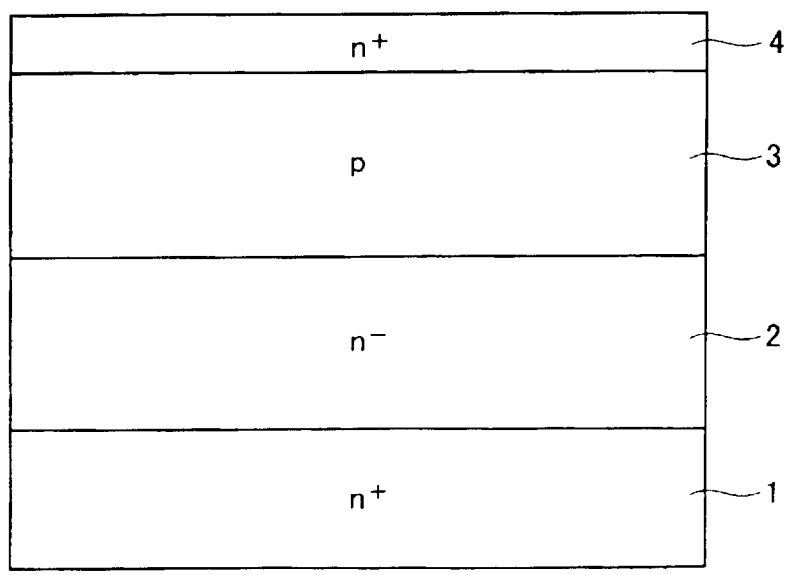
FIG. 4 is a sectional diagram showing a process of forming an $n^+$-type source layer of the MOS transistor.

A fabrication process of the MOS transistor 100 of this embodiment will be explained with reference to FIGS. 3 through 12 below, while using the cross-section of FIG. 2. Firstly as shown in FIG. 3, let an n$^-$-type layer 2 epitaxially grow on a principal surface of n$^+$-type silicon substrate 1. Then, use ion implantation techniques to dope a chosen p-type impurity such as boron (B) or the like into the surface of this n$^-$ layer 2; next, let the doped impurity thermally diffuse, thereby forming a p-type base layer 3. Further as shown in FIG. 4, implant ions of an n-type impurity such as arsenic (As) or else into the surface of p-base layer 3 at a high concentration; then, thermally diffuse the dopant, thereby forming an n$^+$-type source layer 4.

Figure 5:
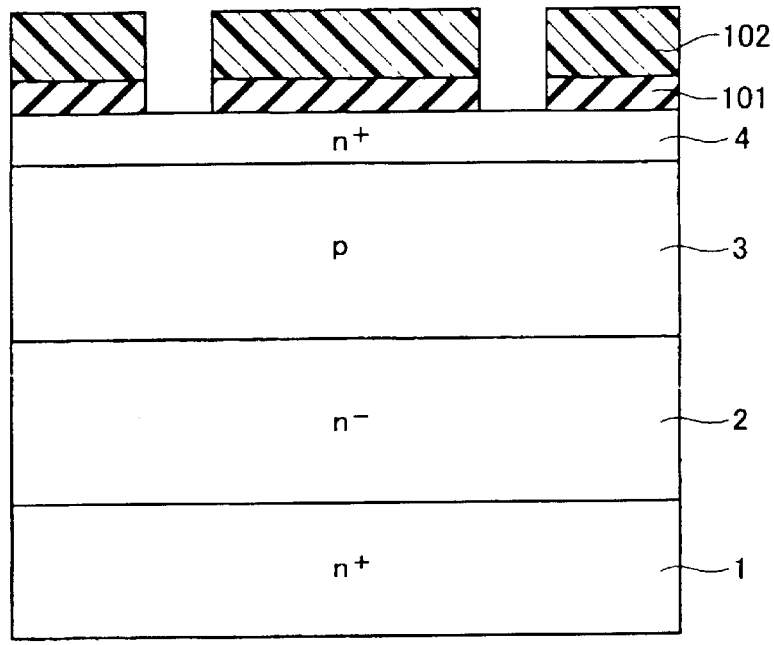
FIG. 5 is a sectional diagram showing an oxide film mask forming process for trench formation of the MOS transistor.
Figure 6:
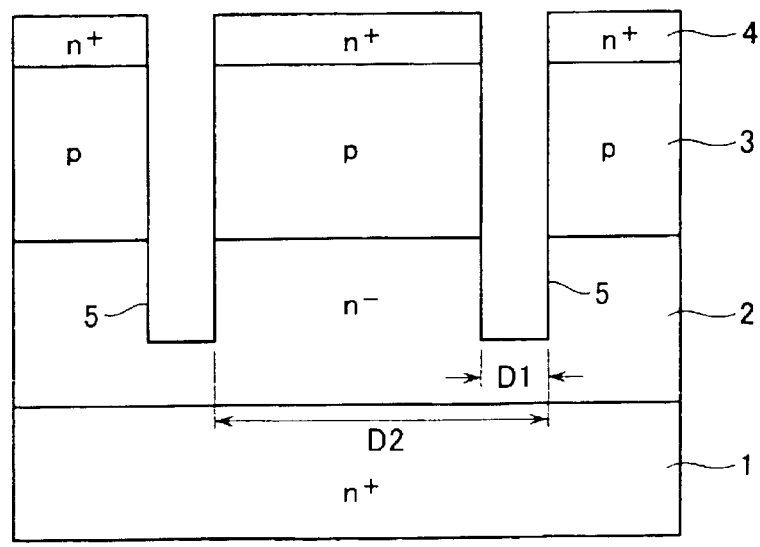
FIG. 6 is a sectional diagram showing a trench formation process of the MOS transistor.

Next as shown in FIG. 5, form on the surface of source layer 4 a silicon oxide film 101; then, lithographically form a pattern of resist mask 102 used for trench formation. Using this resist mask 102, etch silicon oxide film 101 by reactive ion etch (RIE) methods. And, with the patterned silicon oxide film 101 as a mask, silicon etching is performed by RIE methods to form trench 5 to a predetermined depth reaching the n$^-$ layer 2 from source layer 4 as shown in FIG. 6.

More specifically the trench 5 is formed into a pattern which corresponds to the multiple stripe portions 7a and the coupler portions 7b which couple these stripes together, of the gate electrode 7 shown in FIG. 1B. At this time, as shown in FIG. 6, the trench width D1 in the layout direction (short side direction) of the stripe portions 7a is set at 1 μm or below. Let the pitch D2 be several μm.

Figure 7:
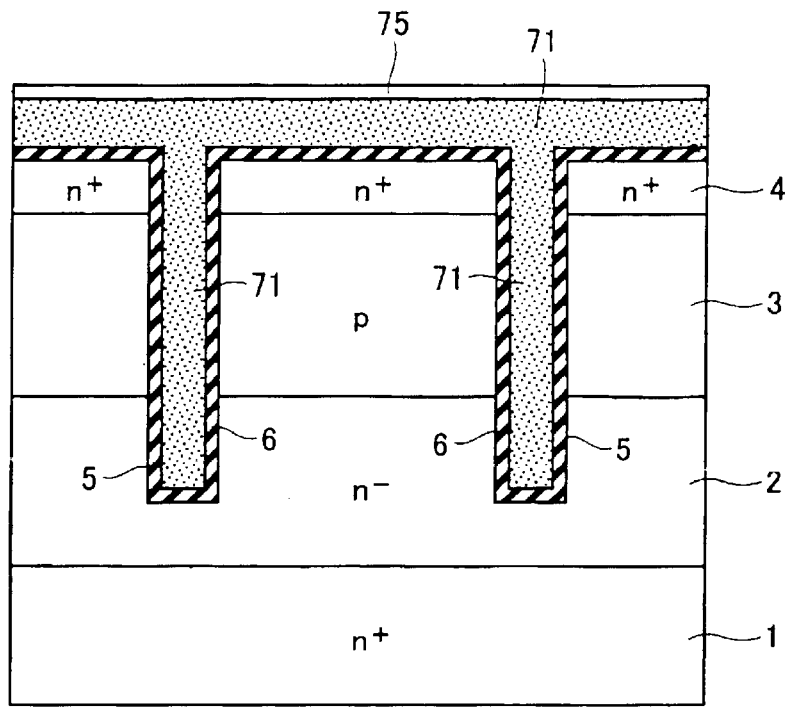
FIG. 7 is a sectional diagram showing a gate polysilicon deposition process of the MOS transistor.

Subsequently, perform thermal oxidation to thereby form a gate insulator film 6 which overlies the bottom surface and sidewall of the trench 5 as shown in FIG. 7. Thereafter, deposit a polysilicon layer 71 on the source layer 4 to a predetermined thickness in such a manner as to completely bury the trench 5 thereunder while making its top surface substantially flat. The polysilicon layer 71 is heavily doped with a chosen impurity such as phosphorus (P) or arsenic (As) or the like at a high concentration. Preferably, deposit on this polysilicon layer 71 a non-doped or "undoped" polysilicon layer 75 with a small thickness. This undoped polysilicon layer 75 will be used to form low resistivity silicide during a silicide process to be later executed.

Figure 8:
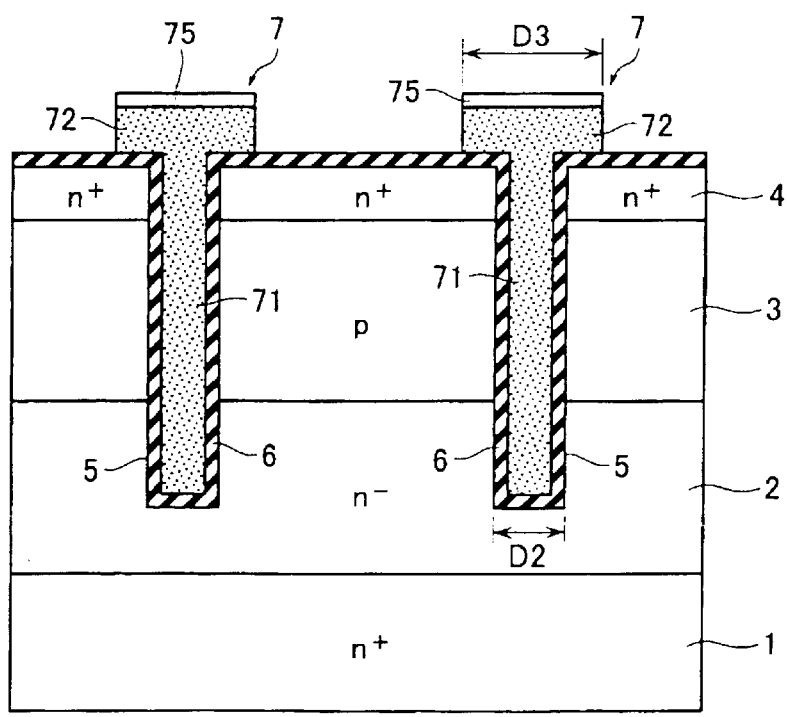
FIG. 8 is a sectional diagram showing a polysilicon patterning process of the MOS transistor.
Figure 9:
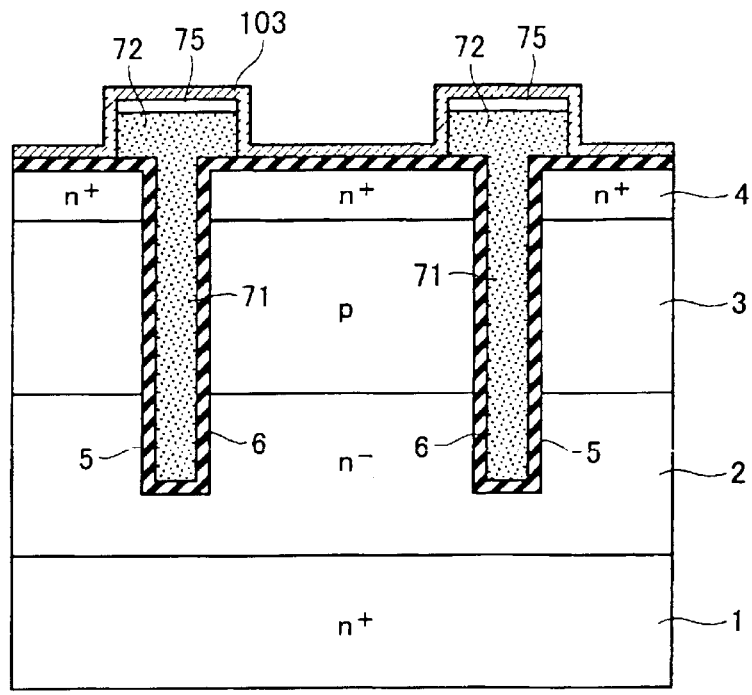
FIG. 9 is a sectional diagram showing a metal film deposition process for polysilicon gate silicide process of the MOS transistor.
Figure 10:
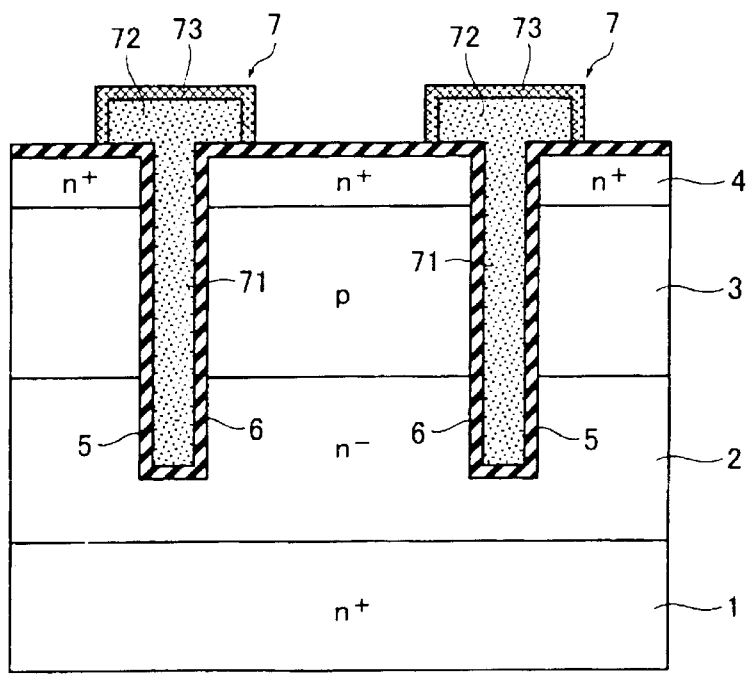
FIG. 10 is a sectional diagram showing a polysilicon gate silicide film formation process of the MOS transistor.

Next, etch the polysilicon layers 71, 75 by use of an etching mask (not shown) which has mask portion with a width D3 greater than the trench width D1. The result of this etching is that the polysilicon layers 71, 75 are patterned together into the gate electrode 7 with a T-shaped profile having a main portion buried in the trench 5 with the width D1 less than 1 μm and an upper end portion 72 which is projected from the upper end opening of its corresponding trench while having the width D3 greater than 1 μm as shown in FIG. 8. Thereafter, as shown in FIG. 9, deposit a Ti/TiN film 103 by sputter methods. And, use rapid thermal anneal (RTA) techniques to thermally process the resultant device structure. This thermal processing causes Ti of the Ti/TiN film 103 to react with polysilicon material, thereby forming a Ti silicide film 73 which overlies an upper surface and sidewall of the individual upper end portion 72 of gate electrode 7 as shown in FIG. 10. At this time, the reaction between the Ti and polysilicon is done under a carefully controlled condition which permits the undoped polysilicon layer 75 to undergo silicidation to be completely converted into a silicide—say, fully "silicidized."

In the case of the silicidation of polysilicon containing therein an impurity at high concentrations, the presence of such impurity gives rise of a bar to electrical resistivity reduction of silicide. On the contrary, with this embodiment, the undoped polysilicon layer 75 is formed on the surface of the impurity-doped polysilicon layer 71 prior to the silicidation processing; thus, fully siliciding this undoped polysilicon layer 75 makes it possible to allow the silicide film 73 to much decrease in resistance. After having formed the silicide film 73 etch away unreacted portions of the Ti/TiN film 103. Thus the gate electrode 7 is completed.

Figure 11:
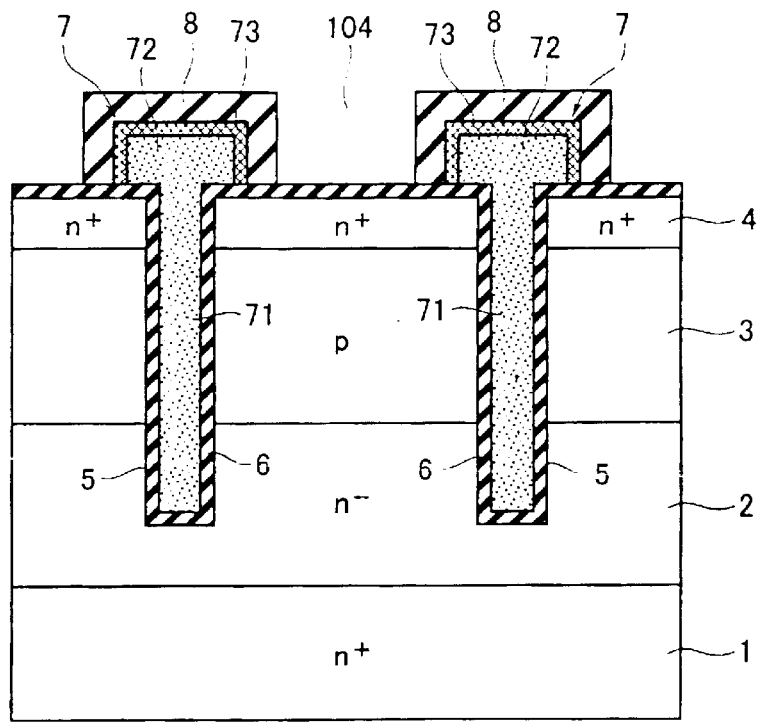
FIG. 11 is a sectional diagram showing an interlayer dielectric film formation process of the MOS transistor.
Figure 12:
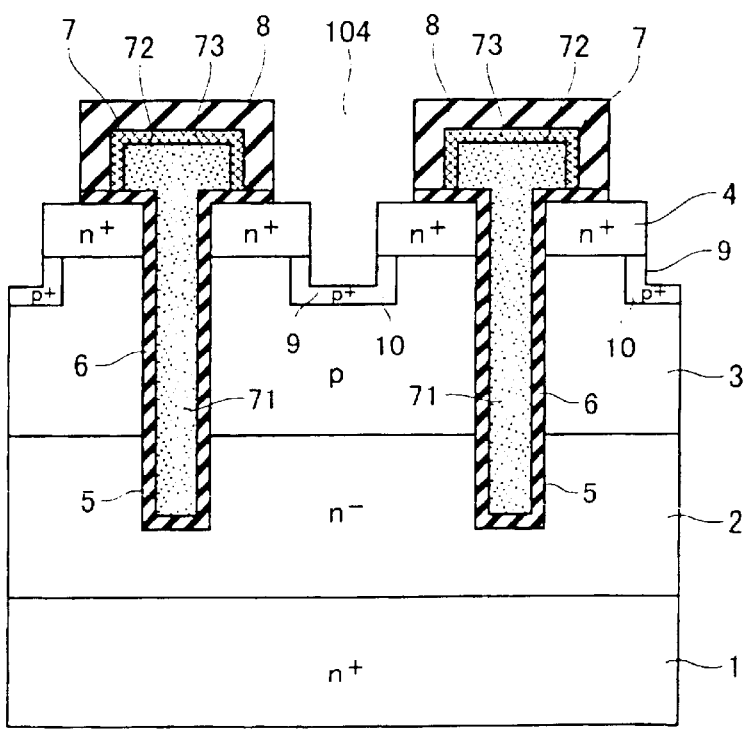
FIG. 12 is a sectional diagram showing a groove formation process of the MOS transistor.

Next as shown in FIG. 11, deposit an interlayer dielectric (ILD) film 8 by chemical vapor deposition (CVD) methods so that ILD film 8 covers the gate electrode 7. Subsequently, define contact openings or holes 104 in ILD film 8 in its source regions each of which is laterally interposed between adjacent portions of the gate electrode 7. At the bottom of each contact hole 104, form a groove 9 which penetrates the source layer 4 and reaches its underlying p-base layer 3 as shown in FIG. 12. This groove 9 has its bottom portion at which the p-base layer 3 is partially exposed. Form a $p^+$-type diffusion layer 10 at such exposed portion of p-base 3.

Lastly as shown in FIG. 2, form a source electrode 11 and a drain electrode 12 on the top and bottom surfaces of resultant structure, respectively, thus completing the intended trench-gate MOS transistor 100. The source electrode 11 is in contact with the source layer 4 and p-base layer 3 of each unit cell through the opening of gate electrode 7.

According to this embodiment discussed above, the polysilicon gate electrode which is buried in a trench as formed to have a width less than or equal to 1 μm has an upper end portion which is projected at a trench opening upper portion while letting this upper end portion have its width greater than the trench width-typically, measure 1 μm or more. Accordingly, in case this polysilicon gate electrode is subjected to silicidation at its surface, in particular in case the silicide film is a $TiSi_2$ film, the thin-line effect may be avoided. This enables achievement of the trench gate structure with low electrical resistances. This in turn makes it possible to obtain an improved power MOS transistor with ultrahigh-speed switching performances.

Figure 13:
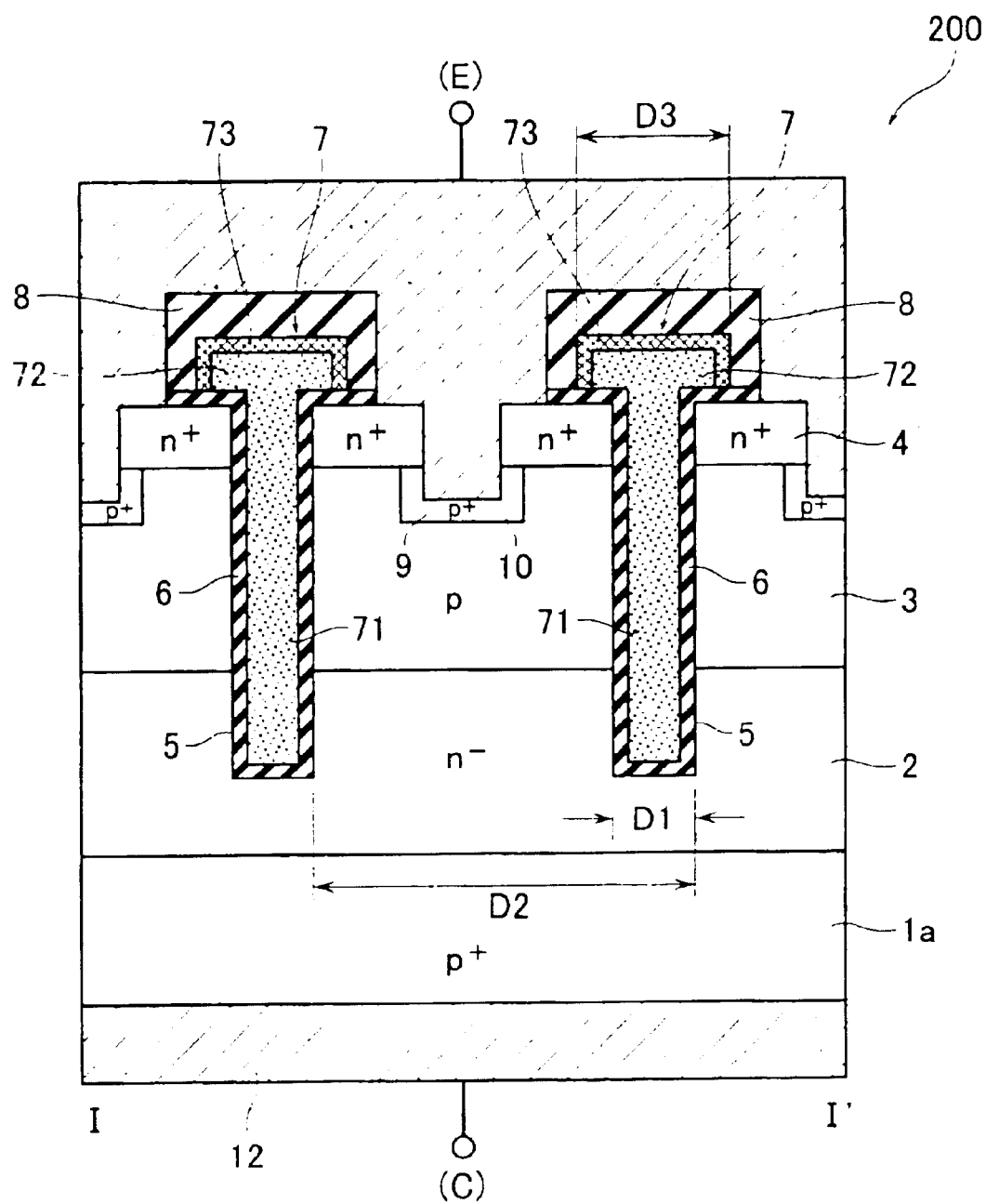
FIG. 13 is a sectional diagram of an insulated-gate bipolar transistor (IGBT) in accordance with another embodiment of this invention.
Figure 14:
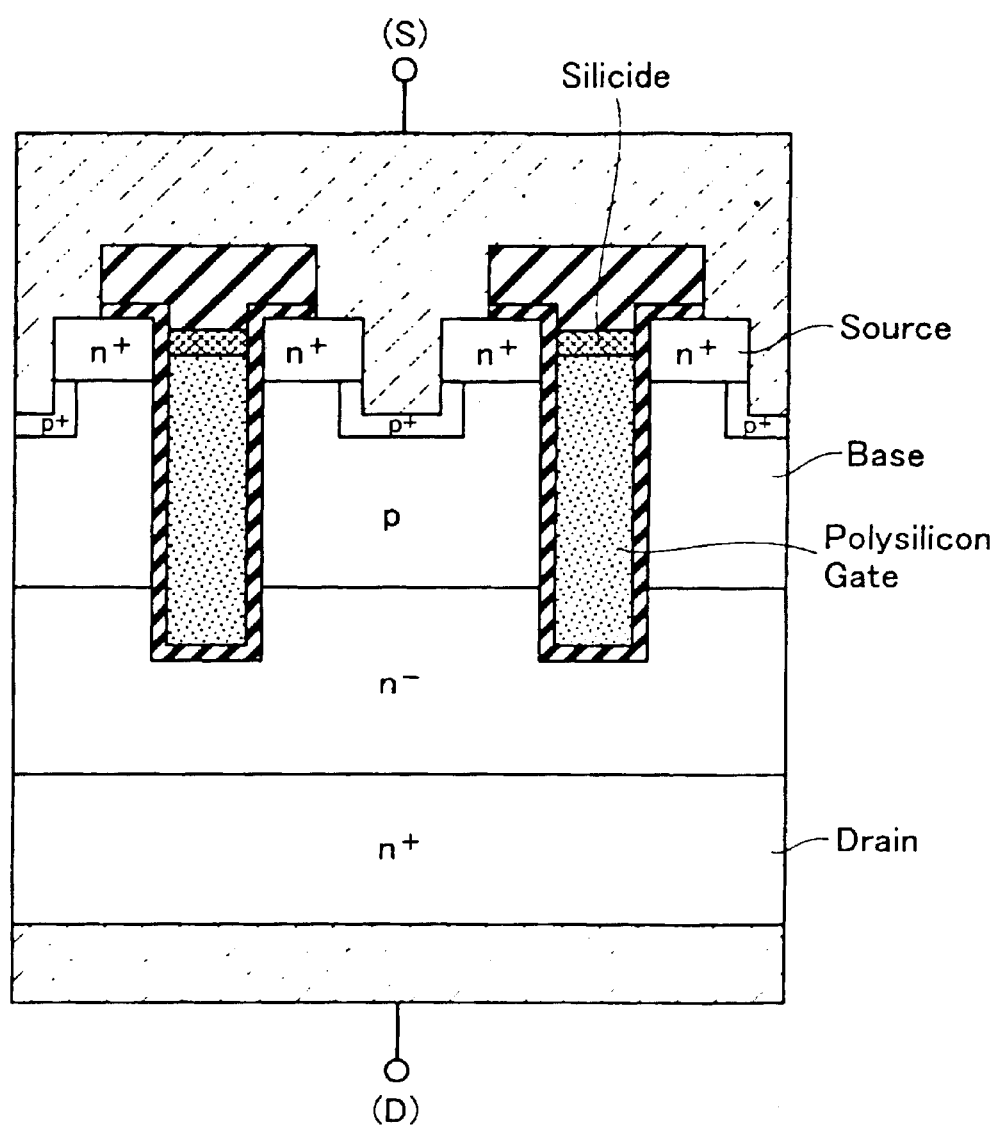
FIG. 14 is a sectional diagram showing one prior known MOS transistor.

Although the above-noted embodiment is specifically drawn to the n-channel MOS transistor, the principles of this invention may also be applicable similarly to p-channel MOS transistors with respective portions reversed in conductivity type. Note here that if the $n^+$-type silicon substrate 1 of the above embodiment is replaced with a $p^+$-type silicon substrate while letting its remaining portions be kept unchanged in structure then the resulting device becomes an insulated gate bipolar transistor (IGBT). Such IGBT structure 200 is shown in FIG. 13 in a way corresponding to FIG. 2. A "pnpn" structure of the IGBT is formed with a $p^+$-type silicon substrate 1a as a collector layer (p-type emitter layer), with the n-type layer 2 and p-type layer 3 as first and second bases respectively and also with the $n^+$-type layer 5 as an n-type emitter layer. By letting the emitter electrode 11 be in contact with both the $n^+$-emitter layer 4 and p-base layer 3, latch-up is precluded. Forming similar trench gate to those of the MOS transistor of the above embodiment makes it possible to obtain a low on-voltage. In addition, the trench-gate thin-line effect is prevented enabling achievement of ultrahigh speed switching performances.

As apparent from the foregoing, according to this invention, it is possible to obtain high-performance trench-gate semiconductor devices even when its trench gate is further decreased in line width.

What is claimed is:

1. A trench gate type semiconductor device comprising:
 a first semiconductor layer having first and second main surfaces;
 a second semiconductor layer of a first conductivity type as formed on said first main surface of said first semiconductor layer;
 a third semiconductor layer of a second conductivity type as formed on said second semiconductor layer;
 a fourth semiconductor layer of the first conductivity type as formed at a surface of said third semiconductor layer;
 a gate electrode having a polycrystalline silicon layer being buried in a trench formed to a depth reaching said second semiconductor layer from a surface of said fourth semiconductor layer with a gate insulating film interposed therebetween and having an upper end portion protruding upwardly from a trench upper end opening while having its width greater than a width of said trench and a metal silicide film formed at an upper surface and side surfaces of said upper end portion of said polycrystalline silicon layer;
 a first main electrode in contact with both said fourth semiconductor layer and said third semiconductor layer; and a second main electrode formed at said second main surface of said first semiconductor layer.

2. The semiconductor device according to claim 1, wherein said gate electrode is formed as a mesh-like pattern.

3. The semiconductor device according to claim 2, wherein said gate electrode is less than or equal to 1 micrometer ($\mu$m) in trench width in a direction of the array of said stripe portions, and wherein said metal silicide film is a titanium (Ti) silicide.

4. The semiconductor device according to claim 2, wherein grooves extending from the surface of said fourth semiconductor layer and reaching said third semiconductor layer are formed between the respective stripe portions of said gate electrode, and wherein said first main electrode is in contact with both said third semiconductor layer and said fourth semiconductor layer in each groove.

5. The semiconductor device according to claim 1, wherein said polycrystalline silicon layer is deposited as a multilayer structure of an impurity doped layer and an undoped layer, and wherein said undoped layer is completely silicidized.

6. The semiconductor device according to claim 1, wherein said semiconductor device is a metal oxide semiconductor (MOS) transistor with said first semiconductor layer as a low resistivity drain layer of the first conductivity type, with said second semiconductor layer as a high resistivity drain layer, with said third semiconductor layer as a base layer, and with said fourth semiconductor layer as a source layer.

7. The semiconductor device according to claim 1, wherein said semiconductor device is an insulated gate bipolar transistor with said first semiconductor layer as a collector layer of the second conductivity type, with said second semiconductor layer as a first base layer, with said third semiconductor layer as a second base layer, and with said fourth semiconductor layer as an emitter layer.

8. A method of fabricating a trench gate type semiconductor device, said method comprising:

forming a second semiconductor layer of a first conductivity type on a first main surface of a first semiconductor layer having first and second main surfaces;

doping an impurity into a surface of said second semiconductor layer to thereby form a third semiconductor layer of a second conductivity type;

doping an impurity into a surface of said third semiconductor layer to form a fourth semiconductor layer of the first conductivity type;

forming a trench extending from a surface of said fourth semiconductor layer and penetrating said third semiconductor layer to have a depth reaching said second semiconductor layer;

after having formed a gate insulating film on inner surfaces of said trench, depositing over said fourth semiconductor layer a polycrystalline silicon layer in such a manner as to completely bury said trench;

etching said polycrystalline silicon layer to form a gate electrode having its main part buried in said trench and an upper end portion protruding upwardly from a trench upper end opening while having a width greater than a width of said trench;

forming a metal silicide film at an upper surface and side surfaces of said upper end portion of said gate electrode; and forming a first main electrode in contact with both said fourth semiconductor layer and said third semiconductor layer and a second main electrode in contact with said second main surface of said first semiconductor layer, respectively.

9. The method according to claim 8, wherein said gate electrode is formed as a mesh-like pattern.

10. The method according to claim 9, wherein said gate electrode is 1 $\mu$m or less in trench width in a direction of the array of said stripe portions, and wherein said metal silicide film is a Ti silicide.

11. The method according to claim 8, wherein said polycrystalline silicon layer is deposited as a multilayer structure of an impurity doped layer and an undoped layer, and wherein said undoped layer is completely silicidized.

12. The method according to claim 8, further comprising:

forming, prior to formation of said first main electrode, a groove extending from the surface of said fourth semiconductor layer and reaching said third semiconductor layer.

13. The method according to claim 8, wherein said semiconductor device is a MOS transistor with said first semiconductor layer as a low resistivity drain layer of the first conductivity type, with said second semiconductor layer as a high resistivity drain layer, with said third semiconductor layer as a base layer, and with said fourth semiconductor layer as a source layer.

14. The method according to claim 8, wherein said semiconductor device is an insulated gate bipolar transistor with said first semiconductor layer as a collector layer of the second conductivity type, with said second semiconductor layer as a first base layer, with said third semiconductor layer as a second base layer, and with said fourth semiconductor layer as an emitter layer.

* * * * *